United States Patent [19]

Goldschmidt

[11] Patent Number: 5,499,023
[45] Date of Patent: Mar. 12, 1996

[54] METHOD OF AND APPARATUS FOR AUTOMATED SENSOR DIAGNOSIS THROUGH QUANTITATIVE MEASUREMENT OF ONE OF SENSOR-TO-EARTH CONDUCTANCE OR LOOP RESISTANCE

[75] Inventor: Robert E. Goldschmidt, Needham, Mass.

[73] Assignee: Kaye Instruments, Inc., Bedford, Mass.

[21] Appl. No.: 890,019

[22] Filed: May 27, 1992

[51] Int. Cl.[6] ........................ B08C 9/10
[52] U.S. Cl. ............... 340/870.37; 340/870.04; 340/517; 73/1 R; 324/691; 364/551.01
[58] Field of Search ........................ 340/508, 511, 340/517, 518, 870.02, 870.04, 870.05, 870.12, 870.13, 870.21, 870.16, 870.17, 514, 515; 324/691, 722, 601; 73/1 R; 364/550, 551.01, 557, 424.03, 424.04

[56] References Cited

U.S. PATENT DOCUMENTS

| | | | |
|---|---|---|---|
| 4,146,750 | 3/1979 | Spiesman | 340/870.13 |
| 4,529,970 | 7/1985 | Wynne | 340/511 |
| 4,549,168 | 10/1985 | Sieradzki | 340/511 |
| 4,567,471 | 1/1986 | Acar | 340/511 |
| 4,675,896 | 6/1987 | Young | 340/517 |
| 4,751,654 | 6/1988 | Lyyra | 340/870.04 |
| 4,885,573 | 12/1989 | Fry et al. | 340/511 |

OTHER PUBLICATIONS

Kaye Digi 4 Process Management Solutions (Product Data Sheet(#500).

*Primary Examiner*—John K. Peng
*Assistant Examiner*—Daniel J. Wu
*Attorney, Agent, or Firm*—Rines and Rines

[57] ABSTRACT

A method of and apparatus for automated sensor validation diagnosis during and before operation of pluralities of sensors connected by multiplex sequence in a loop with analog-to-digital converter voltage measurement apparatus responsive to the sensor signals for the primary task of validating a process under monitor by the sensors, wherein provision is made for periodically or selectively quantitatively measuring either (or both) sensor-to-earth conductance or loop resistance of the sensors to insure sensor viability.

20 Claims, 1 Drawing Sheet

METHOD OF AND APPARATUS FOR AUTOMATED SENSOR DIAGNOSIS THROUGH QUANTITATIVE MEASUREMENT OF ONE OF SENSOR-TO-EARTH CONDUCTANCE OR LOOP RESISTANCE

The present invention relates to methods of and apparatus for diagnosing or determining the viability of sensors used, in turn, to validate or monitor the performance of processes and the like; being more particularly concerned with automatically diagnosing the operability of the sensors as they are poised to make measurements for validating the process.

BACKGROUND OF INVENTION

The art is replete with techniques for using sensors to monitor the performance of a wide variety of industrial and other processes and for calibrating and checking on the zero and span characteristics of the sensors or comparing the same with reference impedances and the like. Among such are, for example, single transmission line-interrogated multiple channel data acquisition systems, as disclosed in U.S. Pat. No. 4,196,417; systems for alternately connecting one or more reference impedances and sensor impedances to a measuring circuit as in U.S. Pat. No. 4,751,654; systems using multiplexing with sample-and-hold test sensors as in U.S. Pat. No. 4,005,273; and systems employing multiplexed signal reference level equalizers, output correction circuits for analog sensors, and/or other analog sensing and signal processing circuitry in current loops, as respectively described in U.S. Pat. Nos. 4,056,686; 4,930,095; and 4,783,659, and the like.

While providing various degrees of sensor monitoring, checking or calibration, however, the prior art appears not to have provided a technique for automatically diagnosing the operational correctness and viability of sensors as they are, in turn, being used to monitor and determine the viability of processes and the like, such as, for example, the temperature, pressure or other parameters involved in the various parts or steps of a manufacturing or other critical process of concern.

The present invention addresses this deficiency by providing for automated sensor diagnosis through quantitative measurement of one of sensor-to-earth conductance (or reciprocal of impedance, more generally), or loop impedance (resistance) of the sensors before and during the sensor monitoring or validating of the process. The term "earth" is also generically used herein to connote grounding, chassis or other reference potential.

OBJECTS OF INVENTION

The object of the invention, accordingly, is to provide a new and improved method of and apparatus for sensor diagnosis during the sensor validation of industrial and other processes; being more specifically oriented to provide for quantitative measurement of sensor-to-earth conductance of sensors used to monitor or validate a critical process, or of loop impedance or resistance of such sensors, controlled periodically or selectively.

Other and further objects will be explained hereinafter and are more particularly delineated in the appended claims.

SUMMARY

In summary, however, from one of its viewpoints, the invention embraces a method of automated sensor validation diagnosis during and before operation of the sensor while connected in a loop with voltage measurement apparatus responsive to the sensor signals for the primary task of validating a process under monitor by the sensor, that comprises, quantatively measuring one of sensor-to-earth conductance and loop resistance of the sensor.

Preferred and best mode designs and implementation are later presented.

DRAWINGS

The invention will now be described with reference to the accompanying drawings.

FIG. 1 of which is a circuit diagram of a preferred leakage conductance measurement apparatus for practicing the invention; and FIG. 2 is a similar diagram of apparatus providing automated sensor diagnosis through quantitative measurement of loop resistance.

DESCRIPTION OF PREFERRED EMBODIMENTS

Figure 1:
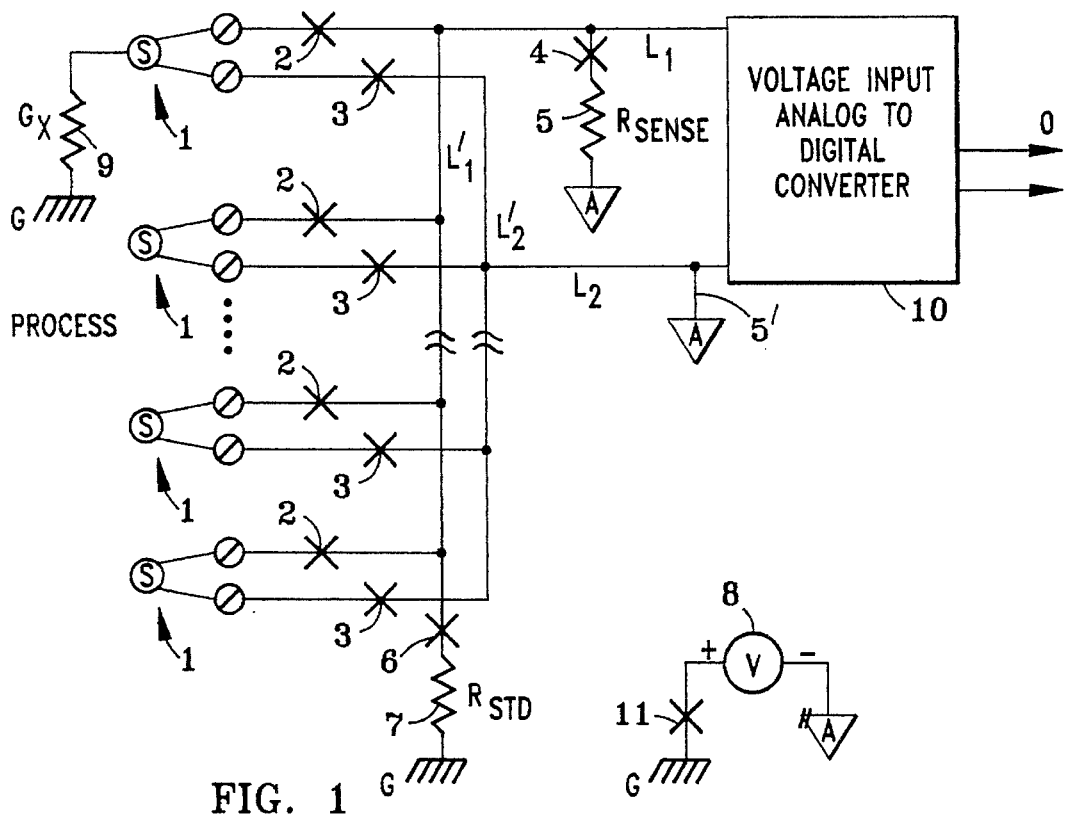

Referring to FIG. 1, a PROCESS, so-labelled, is shown being monitored or validated by a plurality of sensors S, such as, for example, thermocouple or other temperature sensors disposed at various important or critical regions of the PROCESS and connected, as by a conventional multiplexing system, schematically represented by the cross switches 2 and 3 in the respective upper and lower lines $L_1$ and $L_2$ from the sensors S, connected in parallel at $L_1'$ and $L_2'$ and to a common input to a voltage analog-to-digital converter apparatus 10. The output of the converter 10, represented at O, provides digital data converted from and responsive to the analog sensor signals for presentation in well-known fashion, such as recording or monitor display or the like, to permit validating the process operation as sensed by the sensors S at respective regions 1, during the primary task of such process validation.

During such normal measurement operation, control of the multiplexer switching at 2 and 3 is employed to access the voltage produced by the successive individual sensors S at their respective PROCESS sensing regions 1, providing such measurement periodically or selectively in converted digital form at the analog-to-digital converter output 0. By this approach, as is well known and described, for example, in the Kaye Digi 4 Process Management Solutions (Product Data Sheet #500), the PROCESS is being continually monitored or validated by the temperature sensors S under multiprocessor programmed control.

In accordance with the present invention, however, as earlier stated, the facility is provided for also automatically diagnosing the operability and viability of the sensors S themselves under similar periodic or selective automatic or programmed control 13'. This is effected in the case of temperature sensors having a leakage conductance Gx to earth at 9, with the aid of a sensing resistor $R_{sense}$ connectable at 5 by a switch 4 to the upper or high line $L_1$, of the input to the analog-to-digital converter apparatus 10, and to the floating analog ground

, also fed from the line $L_2$ at 5'. A standard resistor $R_{std}$ is also provided at 7, one end of which is shown connected to earth or ground at G, and the upper end is shown connectable by a further switch 6 to the upper or high input lines $L_1'$ and $L_1$. A supplemental and internal voltage source 8 is also provided, connected between the floating analog ground

and, when a switch 11 is closed, to ground G.

The use of the symbol

in the drawing is to indicate a connection to a floating analog ground. Source 8 provides a voltage drive between

and earth to measure conductance.

The above-described supplemental circuit components perform the function of automated sensor viability diagnosis by enabling quantitative measurements of sensor-to-earth conductance in the following manner and under preferably programmed automatic periodic or selective control 13' of a microprocessor 13 as is well-known and above referenced, for the switching. The microprocessor 13 makes the required calculations in conventional fashion, with its control logic processing section 13' controlling the specific switching conditions hereinafter described and triggering the conversion in the A/D converter 10 to read the resulting measurement values, as in common practice.

In order to make such a conductance measurement, all multiplexer switches 3, 2 and 6 are turned off and switch 4, which connects the sensing resistor 5 to the high side of the input to the converter 10, as before explained, and switch 11, which connects the voltage source 8 to earth, are turned on under the program control 13'. A measurement M1 is then made with the analog-to-digital converter 10 and processor 13. A second measurement M2 is next made with the before-described standard resistance $R_{std}$ at 7 connected additionally through switch 6 to line $L_1$. Finally, a third measurement M3 is made with switch 6 turned off and the corresponding switch 2 of the sensor being diagnosed (such as the uppermost sensor S, for example), turned on. The unknown conductance, represented at the uppermost sensor S by the symbol $G_x$ to earth G at 9, is given by the expression:

$$1/G_x 32 \{[(R_{std}+R_{sense})(M2-M1)]/(M3-M1)\}-R_{sense}, \quad (1)$$

Thus, during the validation of the PROCESS by the sensors S (or before), the quantitative measurement of sensor-to-earth conductance, effectable in automatic mode through sequencing the multiplexer and other switches in well-known fashion and in the algorithm above set forth, provides for automated sensor viability diagnosis during the validating of the PROCESS by the sensors. As shown, such is effected through use of the voltage source 8, the sense resistor 5 and the switching at 4 and 11 for connecting them to earth and to the analog-to-digital converter input, respectively.

Offset correction of the measurement may be effected in a sensor, moreover, by disconnecting the unknown sensor conductance ($G_x$) and turning off the appropriate switch(es)

2. Gain correction of measurements may also be achieved for a sensor by connecting the calibration or standard resistance $R_{std}$ through switch 6 after ungrounding $R_{std}$.

In summary, the technique of the invention does not determine the conductance of the sensor loop, but rather the leakage conductance of the entire sensor loop with respect to earth. This serves as a measure of the integrity of the sensor with respect to its surroundings. The A/D converter 10 is shown in FIG. 1 as normally floating and isolated from earth. The ground reference A and voltage sources associated with the converter are also floating. Enabling only switch 11, excites all sensors S via their respective stray conductances Gx by voltage V with respect to analog ground A. The A/D converter measures the resulting series voltage across Rsense, FIG. 1, as part of measurement M3. Measurement M1 determines the voltage across Rsense resulting from the residual conductance to earth in the apparatus, labeled Rstray for further clarity in FIG. 1. The conductance due to Rstray appears in parallel with all subsequent conductance measurements. Measurement M2 determines the voltage value across Rsense when placed in series with Rstd-Rstray. Measurement M3 determines the voltage value across Rsense when placed in series with GX-Rstray.

Figure 2:
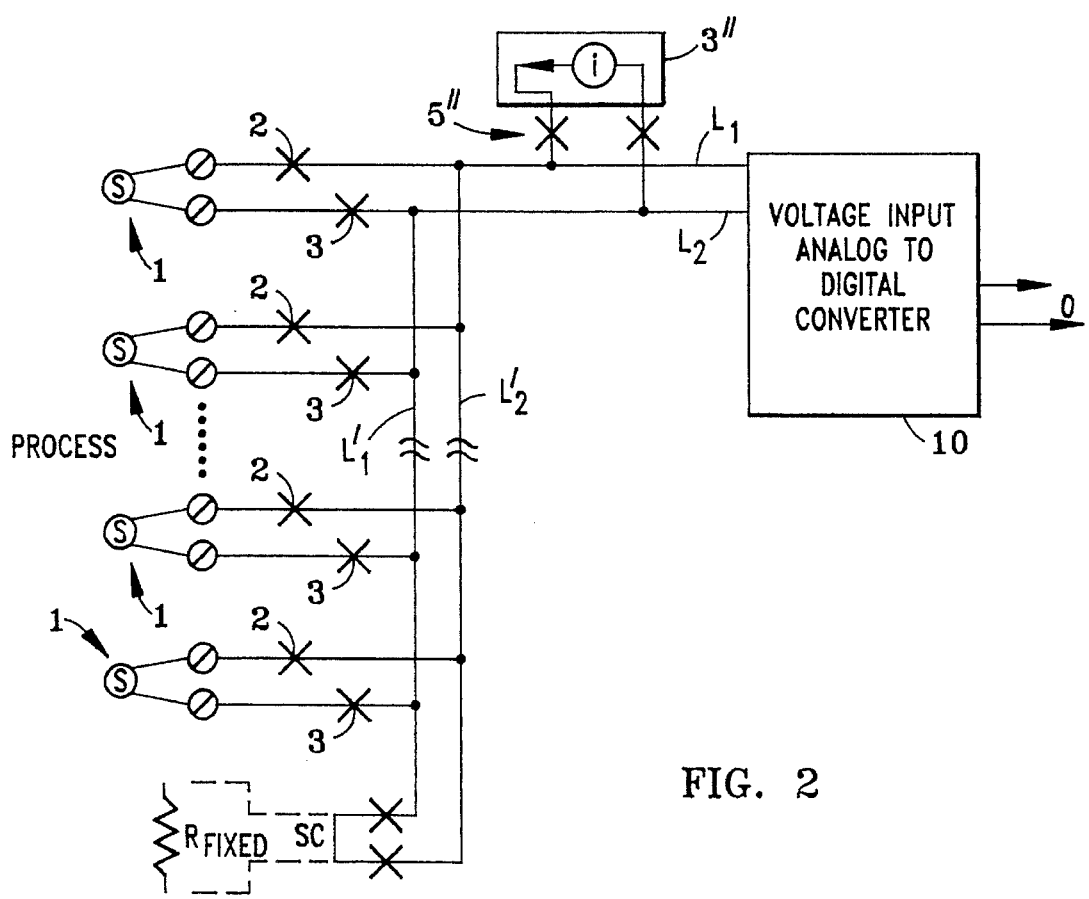

As previously stated, instead of (or, if desired, in addition to) sensor-to-earth conductance measurements, the same result of sensor validation diagnosis may also be achieved by quantitative measurement of loop resistance as in the embodiment of FIG. 2. In this circuit, an internal temperature-stable current source i is provided at 3', connectable by switches 5" across the input lines $L_1$ and $L_2$ to the voltage analog-to-digital converter 10; and a short circuit SC is connectable thereacross by further multiplex position switches 6' to replace the sensors S as will now be described.

While (or before) the sensors S are performing their normal functions of validating the PROCESS, as in the system of FIG. 1, provision is made for sensor validation diagnosis through quantitative measurement of the resistance in the sensor-to-analog-to-digital converter loop ($L_1$–$L_2$) as follows.

A first measurement M1 of voltage by the analog-to-digital converter 10 is made with the multiplexer 2, 3 connecting one of the sensors S at 1 to, and switches 5" disconnecting the before-described temperature-stable current source i at 3' from the analog-to-digital converter input. M1 then represents the voltage produced by the sensor S when no current excitation is present.

A second measurement M2 of voltage is then effected by the analog-to-digital converter 10, with the multiplexer 2,3 connecting one of the sensors 1 to, and switches 5" connecting the temperature-stable current source i at 3' to the analog-to-digital converter input. This current flows out through the multiplexer 2,3 and through the selected sensor 1, producing an added voltage (M2−M1) at the analog-to-digital converter input, which is equal to the value of the current source i times the sum of the sensor resistance and the multiplexer switch resistances.

Mathematically expressed, the value of the sensor 1 resistance is $$R_{sensor}=[(M2-M1)/i]-R_{mpxr}, \quad (2)$$

where i is the current source value and $R_{mpxr}$ is the sum of the multiplexer resistances accessing that particular sensor 1. The values of i and $R_{mpxr}$ are predetermined by a one-time calibration procedure, where measurements $M_{short}$ are made with the sensors replaced by the above-described short circuits SC (through activation of switches 6'), "CALIBRATION" in FIG. 2, and a measurement $M_{fixed}$ is made with a fixed resistance $R_{fixed}$ replacing a particular short circuit SC. Then, $$i=(M_{fixed}-M_{short})/R_{fixed} \qquad (3),$$

and $$R_{mpxr}=M_{short}/i \qquad (4)$$

for each multiplexer position.

Additionally, the change in value of the $R_{mpxr}$ due to temperature may be compensated through use of the internally shorted multiplexer position effected by switches 6' "COMPENSATION", FIG. 2. At calibration time, the value of the internally shorted multiplexer resistance $R_{mpxr-short-cal}$, is also measured.

At the time when the sensor loop resistance is measured, the value of the internally shorted multiplexer resistance SC introduced by switches 6', $R_{mpxr-short-now}$, is also measured. Then the temperature-corrected value is $$R_{sensor}=[(M2-M1)/i]-R_{mpxr}(R_{mpxr-short-now}/R_{mpxr-short-cal}) \qquad (5).$$

Thus, connected sensor loop resistance measurements can be made in systems in which the primary task is to make voltage measurements for the process being monitored and from the very same sensors, through use of the current source i at 3, and the switching of the current source across the multiplexer commons lines $L_1-L_2$ of the loop at 5". Calibration to compensate for internal switch resistances in the measurement path is provided for, with the internally shorted (SC) multiplexer switching position at 6' enabling the provision of temperature compensation of the determined calibration values.

Though exemplarily or illustratively described in connection with resistive type sensors, the methodology underlying the invention may be applied to other types of sensors of different impedance characteristics as well; and further modifications will also occur to those skilled in the art, such being considered to fall within the spirit and scope of the invention as defined in the appended claims.

What is claimed is:

1. Apparatus for automated sensor validation diagnosis during and before operation of a plurality of sensors connected in a loop with voltage measurement apparatus and multiplexed by switching along loop lines to provide successive voltage measurements from the successive sensors to validate a process being monitored at different regions by the sensors, said apparatus having, in combination with voltage measurement apparatus connected to the plurality of process sensors in a loop by a switching multiplexer, an internal voltage source and a sensing impedance connected to earth and to the voltage measurement apparatus, respectively, that provide multiplexed measurements of sensor-to-earth conductance for successive sensors before and during their parameter sensing of the process, thereby providing the determination that the measured conductance still has those values required of properly operating sensors, thus checking the viability of such sensors to validate the process monitored by the sensors.

2. Apparatus as claimed in claim 1 and in which the voltage measurement apparatus comprises an analog-to-digital converter and the sensor-to-earth conductance is measured by:

a) a circuit connecting the sensing impedance, represented by $R_{sense}$, to the input of the said analog-to-digital converter of the voltage measurement apparatus with the multiplexed switching turned off, and connecting the said voltage source to earth, producing a first measurement M1 by said apparatus;

b) a further circuit additionally connecting a standard internal impedance, represented as $R_{std}$, between earth and said input, providing a second measurement M2 by said apparatus; and c) a switch disconnecting said standard impedance $R_{std}$ from said input and connecting the sensor through turning on the multiplexed switching for inputting the sensor signal to said apparatus, providing a third measurement M3 by said apparatus; thereby quantitatively measuring the sensor-to-earth conductance Gx in accordance with the equation $$1/Gx=([(R_{std}+R_{sense})(M2-M1)]/(M3-M1))-R_{sense}.$$

3. Apparatus as claimed in claim 2 and in which an offset correction of measurement is made by a circuit for making a measurement while effectively disconnecting the sensor conductance by turning off the multiplexed switching thereto.

4. Apparatus as claimed in claim 2 and in which a gain correction of measurement is made by a circuit for making a measurement while connecting the earthed standard impedance $R_{std}$ to said input.

5. Apparatus for automated sensor validation diagnosis during and before operation of a plurality of sensors connected in a loop with voltage measurement apparatus and multiplexed by switching along loop lines to provide successive voltage measurements from the successive sensors to validate a process being monitored at different regions by the sensors, said apparatus providing for quantitatively measuring in multiplexing order one of the sensor-to-earth conductance and loop impedance of the sensors, and said apparatus, having, in combination with voltage measurement apparatus connected to the plurality of process sensors in a loop by a switching multiplexer, for sensor-to-earth conductance measurements, an internal voltage source and a sensing impedance to earth and to the voltage measurement apparatus, respectively, that provide multiplexed measurements of sensor-to-earth conductance for successive sensors; and in which, for loop impedance measurement, the apparatus is provided with an internal temperature-stable current source and a circuit for switching the source across the loop lines.

6. Apparatus as claimed in claim 5 and in which the voltage measurement apparatus comprises an analog-to-digital converter apparatus and the loop impedance is measured by a) a circuit connecting a sensor through the multiplexed switching to the analog-to-digital converter apparatus with said current source of value i disconnected therefrom, providing a first measurement M1 by said apparatus;

b) a circuit supplementarily switching the current source across the loop lines and to the input of the analog-to-digital converter apparatus, providing a second measurement M2 by said apparatus; and c) a circuit providing an added voltage (M2-M1) at the input to the analog-to-digital converter apparatus equal to the value of the current source i times the sum of the impedance of the sensor, represented as $R_{sensor}$, and the impedance of the multiplex switching, represented as $R_{mpxr}$, and with the sensor impedance $R_{sensor}$ given by $$R_{sensor}=[(M2-M1)/i]-R_{mpxr}.$$

7. Apparatus as claimed in claim 6 and in which the values of i and $R_{mpxr}$ are determined by the following calibration apparatus:

i) a circuit replacing the sensor by a short circuit and producing a measurement $M_{short}$ by said apparatus; and ii) a circuit replacing the short circuit with a fixed calibrating impedance $R_{fixed}$ for one position and producing a measurement $M_{fixed}$ by said apparatus; whereby the following relationships are attained:

$i=(M_{fixed}-M_{short})/R_{fixed}$, and for each multiplexor position, $R_{mpxr}=M_{short}/i$.

8. Apparatus as claimed in claim 6 and in which a circuit is provided for calibrating the impedance measurement to compensate for internal switching resistances in the loop.

9. Apparatus as claimed in claim 8 and in which the values determined by calibration are temperature compensated by providing a circuit employing a digitally shorted multiplexer position.

10. Apparatus as claimed in claim 5 and in which the voltage measurement apparatus comprises an analog-to-digital converter and the sensor-to-earth conductance is measured by the provision of an internal voltage source and a sensing impedance, with switching means being provided for respectively connecting the voltage source to earth and the sensing impedance to the analog-to-digital converter.

11. Apparatus as claimed in claim 5 and in which the sensing impedance, represented by $R_{sense}$, is converted by the analog-to-digital converter with the multiplexed switching means turned off, by producing a first measurement M1 by the converter as said voltage source is connected to earth; the apparatus being further provided with means for additionally connecting a standard impedance, represented as $R_{std}$, between earth and said high line input, providing for a second measurement M2 by said converter; and means for disconnecting said standard impedance $R_{std}$ from said high line input and connecting the sensor through turning on the multiplexed switching for inputting the sensor signal to said converter, providing for a third measurement M3 by said converter; thereby quantitatively measuring the sensor-to-earth conductance Gx in accordance with the equation $1/Gx=[(R_{std}+R_{sense})(M2-M1)/(M3-M1)]-R_{sense}$.

12. Apparatus as claimed in claim 11 and in which means is provided for enabling an offset correction of measurement by making a measurement while effectively disconnecting the unknown sensor conductance by turning off the multiplexed switching thereto.

13. Apparatus as claimed in claim 11 and in which a gain correction of measurement is provided by a circuit for making a measurement while connecting the earthed standard impedance $R_{std}$ to said high line input.

14. Apparatus as claimed in claim 11 and in which automatic control means is provided for programmably controlling the connecting and switching means to enable the diagnosis of the viability of the sensors during their performance of the task of monitoring the viability of the process, periodically or selectively.

15. Apparatus as claimed in claim 5 and in which the loop impedance is measured by means for connecting a sensor through the multiplexed switching to the analog-to-digital converter with said external current source of value i disconnected therefrom, enabling a first measurement M1 by said converter; and there is further provided means for supplementarily switching the current source across the said loop lines and to the input of the analog-to-digital converter, enabling a second measurement M2 by said apparatus and producing an added voltage (M2−M1) at the input to the analog-to-digital converter equal to the value of the current source i times the sum of the impedance of the sensor, represented as $R_{sensor}$, and the impedance of the multiplex switching, represented as $R_{mpxr}$, and with the sensor impedance $R_{sensor}$ given by $R_{sensor}=[(M2-M1)/i]-R_{mpxr}$.

16. Apparatus as claimed in claim 15 and in which there is further provided means for determining the values of i and $R_{mpxr}$ by means for externally replacing the sensors by a short circuit and producing a measurement $M_{short}$ by said converter; and means for replacing the short circuit with a fixed calibrating impedance $R_{fixed}$ to produce a measurement $M_{fixed}$ by said converter; whereby, for each multiplex switching position, the following relationships are attained:

$i=(M_{fixed}-M_{short})/R_{fixed}$; and $R_{mpxr}=M_{short}/i$.

17. Apparatus as claimed in claim 16 and in which automatic control means is provided for controlling the connecting and switching means to enable the diagnosis of the viability of the sensors during their performance of the task of monitoring the viability of the process.

18. Apparatus as claimed in claim 16 and in which means is provided for calibrating the impedance measurements to compensate for internal switching resistances in the loop.

19. Apparatus as claimed in claim 18 and in which means is provided for temperature-compensating the values determined by calibration by means for internally shorting a multiplexer position.

20. Apparatus as claimed in claim 5 and in which said sensors are temperature-sensing sensors.

* * * * *